United States Patent
Li et al.

(10) Patent No.: US 10,283,511 B2
(45) Date of Patent: May 7, 2019

(54) NON-VOLATILE MEMORY

(71) Applicant: eMemory Technology Inc., Hsinchu (TW)

(72) Inventors: Yi-Hung Li, Hsinchu (TW);
Ming-Shan Lo, Hsinchu (TW);
Cheng-Da Huang, Hsinchu County (TW)

(73) Assignee: eMemory Technology Inc., Hsinchu (TW)

( * ) Notice: Subject to any disclaimer, the term of this patent is extended or adjusted under 35 U.S.C. 154(b) by 0 days.

(21) Appl. No.: 15/465,616

(22) Filed: Mar. 22, 2017

(65) Prior Publication Data
US 2018/0102376 A1   Apr. 12, 2018

Related U.S. Application Data

(60) Provisional application No. 62/406,968, filed on Oct. 12, 2016.

(51) Int. Cl.
| *H01L 27/11524* | (2017.01) |
| *H01L 23/31* | (2006.01) |
| *H01L 23/528* | (2006.01) |
| *H01L 29/06* | (2006.01) |
| *H01L 29/49* | (2006.01) |
| *G11C 7/14* | (2006.01) |
(Continued)

(52) U.S. Cl.
CPC ........ *H01L 27/11524* (2013.01); *G11C 5/145* (2013.01); *G11C 7/14* (2013.01); *G11C 16/10* (2013.01); *G11C 16/28* (2013.01); *G11C 16/30* (2013.01); *G11C 16/3459* (2013.01); *G11C 29/021* (2013.01); *G11C 29/028* (2013.01); *H01L 23/3171* (2013.01); *H01L 23/528* (2013.01); *H01L 29/0649* (2013.01); *H01L 29/4916* (2013.01); *H01L 29/4975* (2013.01)

(58) Field of Classification Search
CPC .......... H01L 27/11524; H01L 29/4975; H01L 29/4916; H01L 29/0649; H01L 23/528; H01L 23/3171
See application file for complete search history.

(56) References Cited

U.S. PATENT DOCUMENTS

| 6,744,105 B1 | 6/2004 | Chen et al. |
| 9,236,453 B2 | 1/2016 | Li et al. |
(Continued)

FOREIGN PATENT DOCUMENTS

| TW | 200536107 | 11/2005 |
| TW | 201513269 | 4/2015 |

OTHER PUBLICATIONS

"Office Action of Taiwan Counterpart Application," dated May 3, 2018, pp. 1-8.

*Primary Examiner* — David Vu
(74) *Attorney, Agent, or Firm* — JCIPRNET

(57) ABSTRACT

A non-volatile memory including memory cells is provided. Each of the memory cells includes a substrate, a floating gate structure, a select gate structure, and a first doped region. The floating gate structure is disposed on the substrate. The select gate structure is disposed on the substrate and located at one side of the floating gate structure. The first doped region is disposed in the substrate at another side of the floating gate structure. The first doped regions between two adjacent memory cells are adjacent to one another and separated from one another.

20 Claims, 4 Drawing Sheets

(51) Int. Cl.
  *G11C 16/28* (2006.01)
  *G11C 16/10* (2006.01)
  *G11C 16/30* (2006.01)
  *G11C 16/34* (2006.01)
  *G11C 29/02* (2006.01)
  *G11C 5/14* (2006.01)

(56) References Cited

U.S. PATENT DOCUMENTS

| | | | |
|---|---|---|---|
| 9,337,287 B2* | 5/2016 | Park | H01L 27/11521 |
| 2007/0194369 A1* | 8/2007 | Koh | H01L 27/115 |
| | | | 257/315 |
| 2012/0074482 A1* | 3/2012 | Jung | H01L 21/28273 |
| | | | 257/316 |
| 2013/0020625 A1* | 1/2013 | Shih | H01L 29/42324 |
| | | | 257/315 |

* cited by examiner

NON-VOLATILE MEMORY

CROSS-REFERENCE TO RELATED APPLICATION

This application claims the priority benefit of U.S. provisional application Ser. No. 62/406,968, filed on Oct. 12, 2016. The entirety of the above-mentioned patent application is hereby incorporated by reference herein and made a part of this specification.

BACKGROUND OF THE INVENTION

Field of the Invention

The invention relates to a memory structure, and more particularly, to a non-volatile memory.

Description of Related Art

Since the non-volatile memory has the advantage of retaining data after being powered off, many electronic products require the non-volatile memory to maintain normal operation when the electronic products are turned on. However, in the non-volatile memory, the issue of program disturbance readily occurs during a programming operation of adjacent memory cells.

SUMMARY OF THE INVENTION

The invention provides a non-volatile memory that can effectively prevent the occurrence of program disturbance between adjacent memory cells.

The invention provides a non-volatile memory including memory cells. Each of the memory cells includes a substrate, a floating gate structure, a select gate structure, and a first doped region. The floating gate structure is disposed on the substrate. The select gate structure is disposed on the substrate and located at one side of the floating gate structure. The first doped region is disposed in the substrate at another side of the floating gate structure. The first doped regions between two adjacent memory cells are adjacent to one another and separated from one another.

According to an embodiment of the invention, in the non-volatile memory, the two adjacent memory cells can be arranged in mirror symmetry.

According to an embodiment of the invention, in the non-volatile memory, first contacts are further included. The first contacts are respectively coupled to the first doped regions and disposed separately from one another.

According to an embodiment of the invention, in the non-volatile memory, the first contacts can be coupled to one another.

According to an embodiment of the invention, in the non-volatile memory, a first interconnect structure is further included. The first contacts are coupled via the first interconnect structure.

According to an embodiment of the invention, in the non-volatile memory, an isolation structure is further included. The isolation structure is disposed between adjacent first doped regions.

According to an embodiment of the invention, in the non-volatile memory, each of the memory cells further includes a second doped region and a third doped region. The second doped region and the third doped region are respectively disposed in the substrate at one side of and another side of the select gate structure. The third doped region is located between the select gate structure and the floating gate structure.

According to an embodiment of the invention, in the non-volatile memory, a second contact is further included. The second contact is coupled to the second doped region in each of the memory cells.

According to an embodiment of the invention, in the non-volatile memory, a second interconnect structure is further included. The second interconnect structure is coupled to the second contact.

According to an embodiment of the invention, in the non-volatile memory, a protective layer is further included. The protective layer covers the floating gate structure.

According to an embodiment of the invention, in the non-volatile memory, the protective layer can be extended to a position between the floating gate structure and the select gate structure.

According to an embodiment of the invention, in the non-volatile memory, the protective layer can be further extended to a position above the select gate structure and cover a portion of the select gate structure.

According to an embodiment of the invention, in the non-volatile memory, a stop layer is further included. The stop layer is disposed on the protective layer and covers the floating gate structure and the select gate structure.

According to an embodiment of the invention, in the non-volatile memory, the floating gate structure includes a floating gate and a first dielectric layer. The floating gate is disposed on the substrate. The first dielectric layer is disposed between the floating gate and the substrate.

According to an embodiment of the invention, in the non-volatile memory, the floating gate is, for instance, a single doped polysilicon layer.

According to an embodiment of the invention, in the non-volatile memory, the floating gate is not coupled to any external voltage.

According to an embodiment of the invention, in the non-volatile memory, the select gate structure includes a select gate and a second dielectric layer. The select gate is disposed on the substrate. The second dielectric layer is disposed between the select gate and the substrate.

According to an embodiment of the invention, in the non-volatile memory, the select gate is coupled to an external voltage.

According to an embodiment of the invention, in the non-volatile memory, the select gate structure further includes a metal silicide layer. The metal silicide layer is disposed on the select gate.

According to an embodiment of the invention, in the non-volatile memory, the non-volatile memory can be a memory array, and the memory array is formed by a repeated arrangement of the two adjacent memory cells as a basic unit.

Based on the above, in the non-volatile memory provided by the invention, the first doped regions between two adjacent memory cells are adjacent to one another and separated from one another. Accordingly, during the programming operation of the selected memory cell, program disturbance between adjacent memory cells can be effectively prevented so as to improve the operational efficiency of the memory device.

In order to make the aforementioned features and advantages of the disclosure more comprehensible, embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
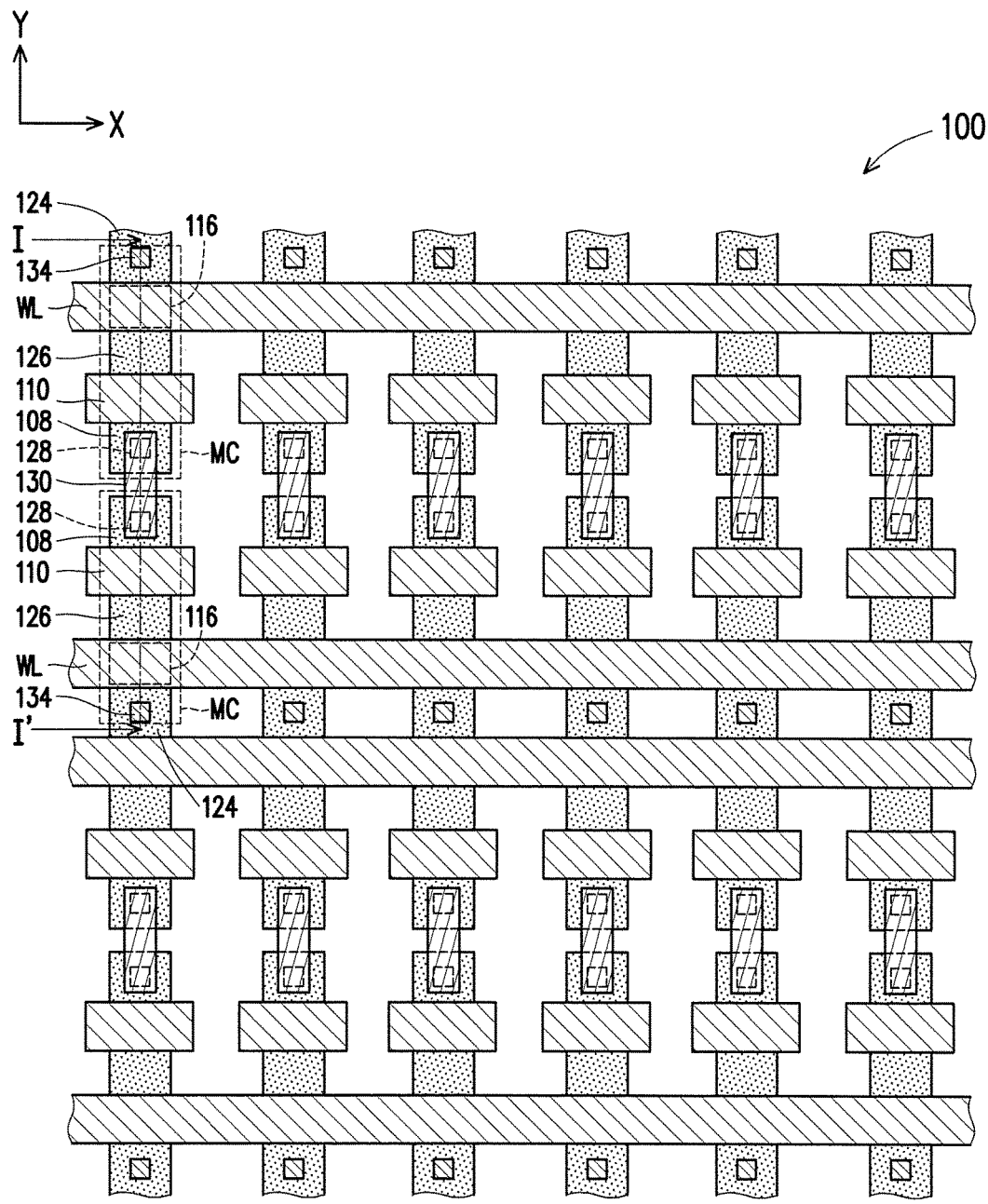
FIG. 1 is a top view of a non-volatile memory of an embodiment of the invention.
Figure 2:
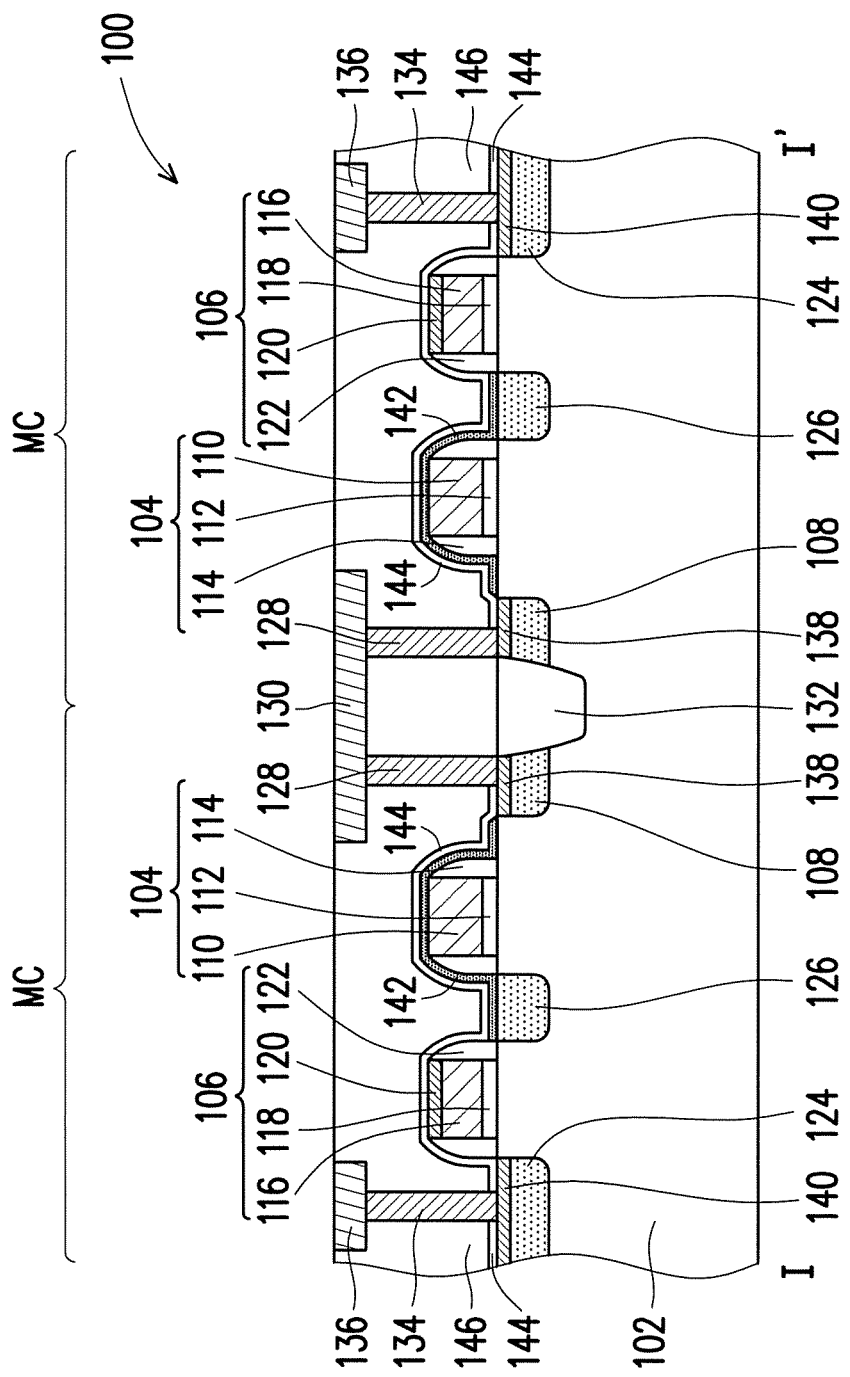
FIG. 2 is a cross-section along section line I-I' in FIG. 1.

FIG. 1 is a top view of a non-volatile memory of an embodiment of the invention. FIG. 2 is a cross-section along section line I-I' in FIG. 1. FIG. 1 omits some of the components in FIG. 2 to more clearly show the relationships between the other components.

Referring to both FIG. 1 and FIG. 2, a non-volatile memory 100 includes memory cells MC. Each of the memory cells MC includes a substrate 102, a floating gate structure 104, a select gate structure 106, and a doped region 108. The non-volatile memory 100 is, for instance, a NOR-type non-volatile memory. The substrate 102 is, for instance, a silicon substrate. Moreover, the memory cells MC can share the substrate 102.

The floating gate structure 104 is disposed on the substrate 102. The floating gate structure 104 includes a floating gate 110 and a dielectric layer 112. The floating gate 110 is disposed on the substrate 102. The floating gate 110 is, for instance, a single doped polysilicon layer. The forming method of the floating gate 110 is, for instance, a chemical vapor deposition method. In the present embodiment, the floating gate 110 is exemplified by not being coupled to any external voltage. The dielectric layer 112 is disposed between the floating gate 110 and the substrate 102. The material of the dielectric layer 112 is, for instance, silicon oxide. The forming method of the dielectric layer 112 is, for instance, a thermal oxidation method or a chemical vapor deposition method.

Moreover, the floating gate structure 104 can further include a spacer 114. The spacer 114 is disposed on the sidewall of the floating gate 110. The material of the spacer 114 is, for instance, silicon nitride. The forming method of the spacer 114 is, for instance, a chemical vapor deposition method.

The select gate structure 106 is disposed on the substrate 102 and located at one side of the floating gate structure 104. The select gate structure 106 includes a select gate 116 and a dielectric layer 118. The select gate 116 is disposed on the substrate 102. The material of the select gate 116 is, for instance, doped polysilicon. The forming method of the select gate 116 is, for instance, a chemical vapor deposition method. In the present embodiment, the select gate 116 is exemplified by being coupled to an external voltage. The dielectric layer 118 is disposed between the select gate 116 and the substrate 102. The material of the dielectric layer 118 is, for instance, silicon oxide. The forming method of the dielectric layer 118 is, for instance, a thermal oxidation method or a chemical vapor deposition method.

Moreover, the select gate structure 106 can further include at least one of a metal silicide layer 120 and a spacer 122. The metal silicide layer 120 is disposed on the select gate 116. The material of the metal silicide layer 120 is, for instance, cobalt/nickel silicide. The forming method of the metal silicide layer 120 is, for instance, performing a self-aligned metal silicide process. The spacer 122 is disposed on the side all of the select gate 116. The material of the spacer 122 is, for instance, silicon nitride. The forming method of the spacer 122 is, for instance, a chemical vapor deposition method.

The doped region 108 is disposed in the substrate 102 at another side of the floating gate structure 104. The doped regions 108 between two adjacent memory cells MC are adjacent to one another and separated from one another. As a result, program disturbance between adjacent memory cells MC can be effectively prevented. The two adjacent memory cells MC can be arranged in mirror symmetry. The doped region 108 can be a P-type doped region or an N-type doped region. The forming method of the doped region 108 is, for instance, an ion implantation method.

Each of the memory cells MC further includes a doped region 124 and a doped region 126. The doped region 124 and the doped region 126 are respectively disposed in the substrate 102 at one side of and another side of the select gate structure 106. The doped region 126 is located between the select gate structure 106 and the floating gate structure 104. The doped region 124 and the doped region 126 can be a P-type doped region or an N-type doped region respectively. The forming method of the doped region 124 and the doped region 126 is, for instance, an ion implantation method.

The non-volatile memory 100 can further include at least one of contacts 128, an interconnect structure 130, an isolation structure 132, a contact 134, an interconnect structure 136, a metal silicide layer 138, a metal silicide layer 140, a protective layer 142, a stop layer 144, and a dielectric layer 146.

The contacts 128 are respectively coupled to the doped regions 108 and disposed separately from one another. The contacts 128 can be coupled to one another. For instance, the contacts 128 can be coupled via the interconnect structure 130 and can be coupled to a bit line (not shown) via the interconnect structure 130. The material of the contacts 128 is, for instance, tungsten. The material of the interconnect structure 130 is, for instance, copper or aluminum. The forming method of the contacts 128 and the interconnect structure 130 is, for instance, a damascene method or a combination of a deposition process, a lithography process, and an etching process.

The isolation structure 132 is disposed between adjacent doped regions 108 and is used to isolate the adjacent doped regions 108. The isolation structure 132 is, for instance, a shallow trench isolation (STI) structure. The material of the isolation structure 132 is, for instance, silicon oxide.

The contact 134 is coupled to the doped region 124 in each of the memory cells MC. The interconnect structure 136 is coupled to the contact 134. The doped region 124 can be coupled to a source line (not shown) via the interconnect structure 136. The material of the contact 134 is, for instance, tungsten. The material of the interconnect structure 136 is, for instance, copper or aluminum. The forming method of the contact 134 and the interconnect structure 136 is, for instance, a damascene method or a combination of a deposition process, a lithography process, and an etching process.

In FIG. 2, the interconnect structure 130 and the interconnect structure 136 are only schematic illustrations and the invention is not limited thereto. In actuality, the interconnect structure 130 and the interconnect structure 136 can be a conductive line or a combination of the conductive lines and plugs, and those having ordinary skill in the art can design and adjust the configurations of the interconnect structure 130 and the interconnect structure 136 based on actual need.

The metal silicide layer 138 and the metal silicide layer 140 are respectively disposed on the doped region 108 and the doped region 124. The material of the metal silicide layer 138 and the metal silicide layer 140 is, for instance, cobalt/nickel silicide. The forming method of the metal silicide layer 138 and the metal silicide layer 140 is, for instance, performing a self-aligned metal silicide process.

The protective layer 142 covers the floating gate structure 104. The protective layer 142 can be used to expose the portions in which the metal silicide layer 120, the metal silicide layer 138, and the metal silicide layer 140 are to be formed. The material of the protective layer 142 is, for instance, silicon oxide. The forming method of the protective layer 142 is, for instance, a chemical vapor deposition method. In the present embodiment, the protective layer 142 can be extended to a position between the floating gate structure 104 and the select gate structure 106. In another embodiment, the protective layer 142 can be further extended to a position above the select gate structure 106 and cover a portion of the select gate structure 106.

The stop layer 144 is disposed on the protective layer 142 and covers the floating gate structure 104 and the select gate structure 106 and can be used as an etch-stop layer. The material of the stop layer 144 is, for instance, silicon nitride. The forming method of the stop layer 144 is, for instance, a chemical vapor deposition method.

The dielectric layer 146 is disposed on the stop layer 144 and can expose the interconnect structure 130 and the interconnect structure 136. The dielectric layer 146 can be a single-layer structure or a multi-layer structure. The material of the dielectric layer 146 is, for instance, silicon oxide. The forming method of the dielectric layer 146 is, for instance, a chemical vapor deposition method.

Moreover, the non-volatile memory 100 can be a memory array, and the memory array is formed by the repeated arrangement of the two adjacent memory cells MC as a basic unit. In the memory array of FIG. 1, the word lines WL can couple the select gates 116 located in the X direction. In the present embodiment, the select gate 116 can be a portion of the word lines WL, but the invention is not limited thereto. Bit lines (not shown) can couple the doped regions 108 located in the Y direction. Source lines (not shown) can couple the doped regions 124 located in the Y direction. Moreover, those having ordinary skill in the art can design and adjust the wiring method and the number of the word lines, the bit lines, and the source lines of the memory array based on actual need.

It can be known from the above embodiments that, in the non-volatile memory 100, the doped regions 108 between two adjacent memory cells MC are adjacent to one another and separated from one another. Accordingly, during the programming operation of the selected memory cell MC, program disturbance between adjacent memory cells MC can be effectively prevented so as to improve the operational efficiency of the memory device.

Figure 3:
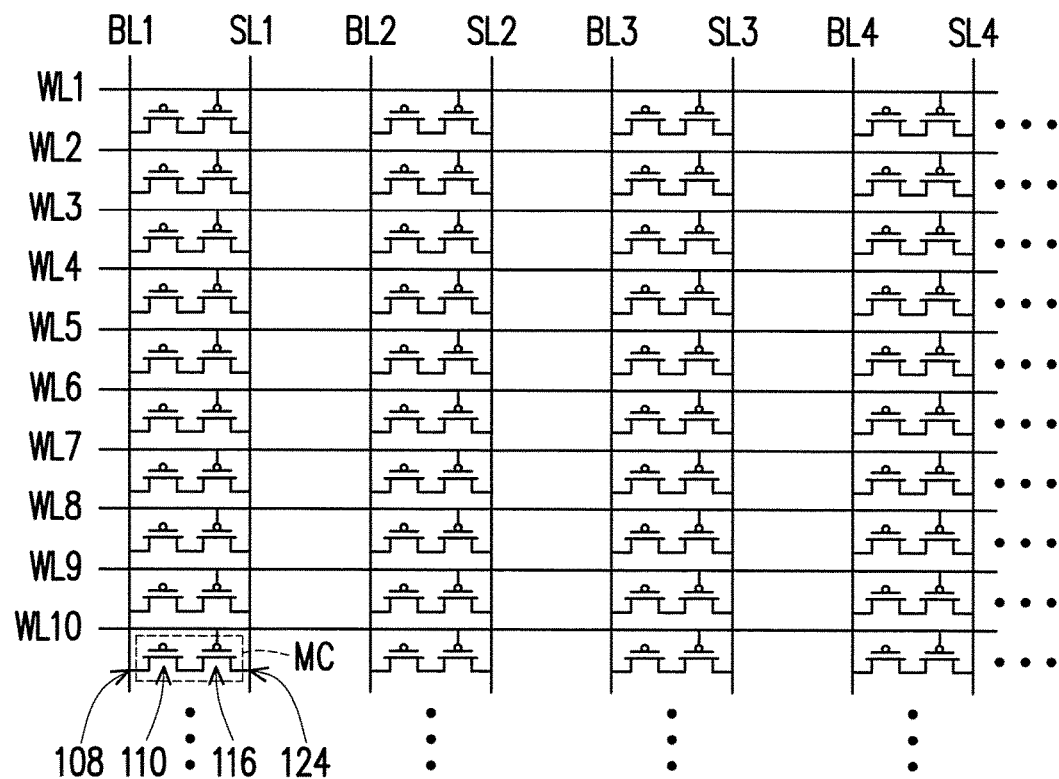
FIG. 3 is a schematic circuit diagram of the non-volatile memory of FIG. 1.

FIG. 3 is a schematic circuit diagram of the non-volatile memory of FIG. 1. In FIG. 3, the word lines, the bit lines, and the source lines are labeled in order.

Referring to both FIG. 1 and FIG. 3, the non-volatile memory 100 includes memory cells MC, word lines WL1 to WL10, bit lines BL1 to BL4, and source lines SL1 to SL4. The select gates 116 of the memory cells MC are respectively coupled to the word lines WL1 to WL10, the doped regions 108 of the memory cells MC are respectively coupled to the bit lines BL1 to BL4, and the doped regions 124 of the memory cells MC are respectively coupled to the source lines SL1 to SL4 to form a memory array. Moreover, those having ordinary skill in the art can adjust the number of the word lines, the bit lines, and the source lines in the memory array based on actual need. In another embodiment, the source lines SL1 to SL4 can be all connected together.

Figure 4:
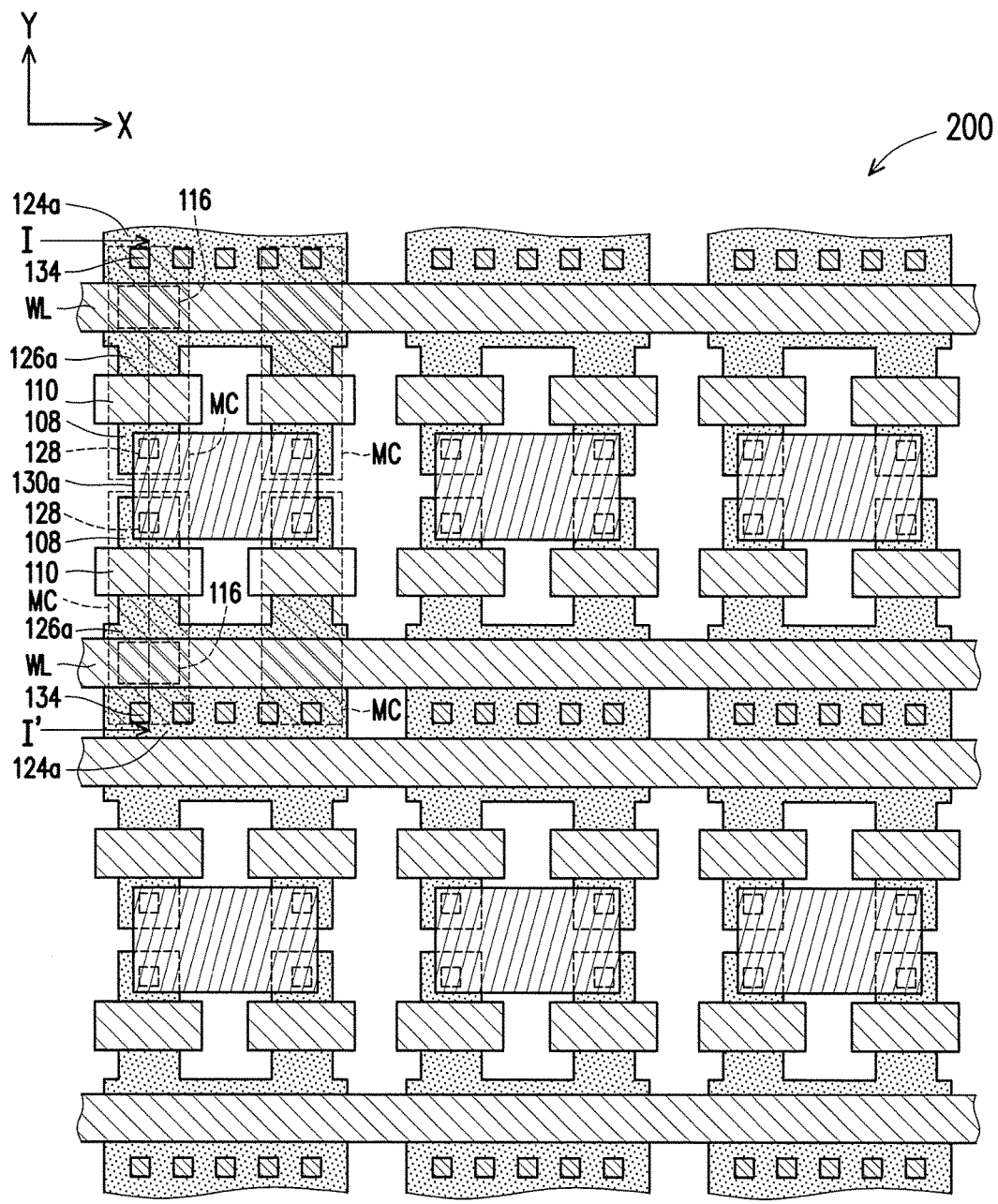
FIG. 4 is a top view of a non-volatile memory of another embodiment of the invention.

FIG. 4 is a top view of a non-volatile memory of another embodiment of the invention.

Referring to both FIG. 1 and FIG. 4, a non-volatile memory 200 of FIG. 4 and the non-volatile memory 100 of FIG. 1 have differences as follows. The non-volatile memory 100 of FIG. 1 is a one-cell-per-bit type memory, and the non-volatile memory 200 of FIG. 4 is a two-cells-per-bit type memory. In detail, the interconnect structure 130 of FIG. 1 couples the adjacent contacts 128 only in the Y direction. The interconnect structure 130a of FIG. 4 couples the adjacent contacts 128 in the Y direction and further couples the adjacent contacts 128 in two adjacent memory cells MC in the X direction. In addition, in the non-volatile memory 200 of FIG. 4, the doped regions 124 of FIG. 1 in the two adjacent memory cells MC in the X direction can be connected by doping to form a doped region 124a. In this way, the nonvolatile memory 200 of FIG. 4 can be the two-cells-per-bit type memory, thereby the non-volatile memory 200 can have a higher reliability. Furthermore, in the non-volatile memory 200 of FIG. 4, the doped regions 126 of FIG. 1 in the two adjacent memory cells MC in the X direction can be connected to form a doped region 126a. Moreover, the shape of the doped region 124a and the shape of the doped region 126a are not limited to those in FIG. 4, and persons of ordinary skill in the art can adjust the shape of the doped region 124a and the shape of the doped region 126a according to the product design requirements. In another embodiment, the doped regions 124 of FIG. 1 in the two adjacent memory cells MC in the X direction can be connected by an interconnect structure (not shown) instead of by doping.

Based on the above, in the non-volatile memory of an embodiment of the invention, since the doped regions between two adjacent memory cells are adjacent to one another and separated from one another, that is to say, the doped regions between two adjacent memory cells are physically isolated, program disturbance between adjacent memory cells can be effectively prevented to improve the operational efficiency of the memory device.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A non-volatile memory, comprising memory cells, wherein each of the memory cells comprises:
    a substrate;
    a floating gate structure disposed on the substrate;
    a select gate structure disposed on the substrate and located at one side of the floating gate structure; and
    a first doped region disposed in the substrate at another side of the floating gate structure, wherein
    two first doped regions between two adjacent memory cells are adjacent to one another and separated from one another, and
    the two adjacent memory cells are arranged in mirror symmetry.

2. The non-volatile memory of claim 1, further comprising first contacts respectively coupled to the first doped regions and disposed separately from one another.

3. The non-volatile memory of claim 2, wherein the first contacts are coupled to one another.

4. The non-volatile memory of claim 3, further comprising a first interconnect structure, wherein the first contacts are coupled via the first interconnect structure.

5. The non-volatile memory of claim 1, further comprising an isolation structure disposed between the adjacent first doped regions.

6. The non-volatile memory of claim 1, wherein each of the memory cells further comprises a second doped region and a third doped region respectively disposed in the substrate at one side of and another side of the select gate structure, wherein the third doped region is located between the select gate structure and the floating gate structure.

7. The non-volatile memory of claim 6, further comprising a second contact coupled to the second doped region in each of the memory cells.

8. The non-volatile memory of claim 7, further comprising a second interconnect structure coupled to the second contact.

9. The non-volatile memory of claim 1, further comprising a protective layer covering the floating gate structure.

10. The non-volatile memory of claim 9, wherein the protective layer is extended to a position between the floating gate structure and the select gate structure.

11. The non-volatile memory of claim 10, wherein the protective layer is further extended to a position above the select gate structure and covers a portion of the select gate structure.

12. The non-volatile memory of claim 9, further comprising a stop layer disposed on the protective layer and covering the floating gate structure and the select gate structure.

13. The non-volatile memory of claim 1, wherein the floating gate structure comprises:
    a floating gate disposed on the substrate; and
    a first dielectric layer, disposed between the floating gate and the substrate.

14. The non-volatile memory of claim 13, wherein the floating gate comprises a single doped polysilicon layer.

15. The non-volatile memory of claim 13, wherein the floating gate is not coupled to any external voltage.

16. The non-volatile memory of claim 1, wherein the select gate structure comprises:
    a select gate disposed on the substrate; and
    a second dielectric layer disposed between the select gate and the substrate.

17. The non-volatile memory of claim 16, wherein the select gate is coupled to an external voltage.

18. The non-volatile memory of claim 16, wherein the select gate structure further comprises a metal silicide layer disposed on the select gate.

19. The non-volatile memory of claim 1, wherein the non-volatile memory comprises a memory array, and the memory array is formed by a repeated arrangement of the two adjacent memory cells as a basic unit.

20. A non-volatile memory, comprising:
    memory cells, wherein each of the memory cells comprises:
        a substrate;
        a floating gate structure disposed on the substrate;
        a select gate structure disposed on the substrate and located at one side of the floating gate structure;
        a first doped region disposed in the substrate at another side of the floating gate structure, wherein two first doped regions between two adjacent memory cells are adjacent to one another and separated from one another;
        a second doped region and a third doped region respectively disposed in the substrate at one side of and another side of the select gate structure, wherein the second doped region is directly adjacent to the select gate structure, and the third doped region is located between the select gate structure and the floating gate structure; and
        a protective layer covering a top surface and sidewalls of the floating gate structure; and
    a second contact coupled to the second doped region in each of the memory cells.

* * * * *